(12) United States Patent
Moctezuma et al.

(10) Patent No.: US 10,819,234 B2
(45) Date of Patent: Oct. 27, 2020

(54) SWITCHING CONVERTER WITH A SELF-OPERATED NEGATIVE BOOST SWITCH

(71) Applicant: TEXAS INSTRUMENTS INCORPORATED, Dallas, TX (US)

(72) Inventors: Ariel Dario Moctezuma, Richardson, TX (US); Hasibur Rahman, Wylie, TX (US); William Krenik, Garland, TX (US); Yanqing Li, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/428,588

(22) Filed: May 31, 2019

(65) Prior Publication Data
US 2020/0099295 A1 Mar. 26, 2020

Related U.S. Application Data

(60) Provisional application No. 62/736,590, filed on Sep. 26, 2018.

(51) Int. Cl.
| *H02M 3/158* | (2006.01) |
| *H01L 29/78* | (2006.01) |
| *H02M 1/088* | (2006.01) |
| *H02M 1/00* | (2006.01) |

(52) U.S. Cl.
CPC ........ *H02M 3/158* (2013.01); *H01L 29/7821* (2013.01); *H02M 1/088* (2013.01); *H02M 2001/0048* (2013.01)

(58) Field of Classification Search
CPC .................. H02M 3/158; H02M 3/157; H02M 2001/009; H02M 2001/0003; H02M 3/22; H02M 3/335
See application file for complete search history.

(56) References Cited

U.S. PATENT DOCUMENTS 9,203,312 B2 * 12/2015 Chesneau ............. H02M 3/156
2017/0324323 A1 * 11/2017 Liu ......................... H02M 1/08

* cited by examiner

*Primary Examiner* — Adolf D Berhane
*Assistant Examiner* — Afework S Demisse
(74) *Attorney, Agent, or Firm* — Michael A. Davis, Jr.; Charles A. Brill; Frank D. Cimino (57) ABSTRACT

A system includes an inductor, and a first switch coupled between a first end of the inductor and a voltage supply node. The system also includes a second switch coupled between the first end of the inductor and a negative output supply node, wherein the second switch comprises a self-operated arrangement. The system also includes a third switch coupled between a second end of the inductor and a positive output supply node. The system also includes a fourth switch coupled between the second end of the inductor and a ground node. The system also includes a controller coupled to the first, second, third, and fourth switches.

19 Claims, 7 Drawing Sheets

SWITCHING CONVERTER WITH A SELF-OPERATED NEGATIVE BOOST SWITCH

CROSS-REFERENCE TO RELATED APPLICATIONS

This application claims priority to U.S. Provisional Application No. 62/736,590, filed Sep. 26, 2018, which is hereby incorporated by reference.

BACKGROUND

Power supplies and power converters are used in a variety of electronic systems. Electrical power is generally transmitted over long distances as an alternating current (AC) signal. The AC signal is divided and metered as desired for each business or home location, and is often converted to direct current (DC) for use with individual electronic devices or components. Modern electronic systems often employ devices or components designed to operate using different DC voltages. Accordingly, different DC-DC converters, or a DC-DC converter that supports a wide range of output voltages, are needed for such systems.

There are many different DC-DC converter topologies. The available topologies differ with regard to the components used, the amount of power handled, the input voltage(s), the output voltage(s), efficiency, reliability, size and/or other characteristics. One example DC-DC converter topology is a single-input multiple-output (SIMO) converter, which provides multiple outputs by charging and selectively discharging a single inductor to different nodes. In some SIMO converter scenarios, low efficiency and output oscillations may occur due to the components used as well as control issues.

SUMMARY

In accordance with at least one example of the disclosure, a system comprises includes an inductor, and a first switch coupled between a first end of the inductor and a voltage supply node. The system also comprises a second switch coupled between the first end of the inductor and a negative output supply node, wherein the second switch has a self-operated arrangement. The system also comprises a third switch coupled between a second end of the inductor and a positive output supply node. The system also comprises a fourth switch coupled between the second end of the inductor and a ground node. The system also comprises a controller coupled to the first, second, third, and fourth switches.

In accordance with at least one example of the disclosure, a switching converter circuit comprises a first switch coupled between a first inductor node and a voltage supply node. The switching converter circuit also comprises a second switch coupled between the first inductor node and a negative output supply node. The second switch comprises a laterally diffused metal oxide semiconductor (LDMOS) transistor with a control terminal coupled to a regulation circuit. The regulation circuit is configured to maintain a voltage at the control terminal of the LDMOS transistor at a reference voltage equal to a voltage level at the negative output supply node plus an offset. The switching converter circuit also comprises a third switch coupled between a second inductor node and a positive output supply node. The switching converter circuit also comprises a fourth switch coupled between the second inductor node and a ground node. The switching converter circuit also comprises a controller coupled to the first, second, third, and fourth switches.

In accordance with at least one example of the disclosure, a device comprises a first switch coupled between a first inductor node and a voltage supply node. The device also comprises a second switch coupled between the first inductor node and a negative output supply node, wherein the second switch comprises a laterally diffused metal oxide semiconductor (LDMOS) transistor and a diode-connected P-type metal oxide semiconductor (PMOS) transistor. The device also comprises a third switch coupled between a second inductor node and a positive output supply node. The device also comprises a fourth switch coupled between the second inductor node and a ground node. The device also comprises a controller coupled to the first, second, third, and fourth switches.

BRIEF DESCRIPTION OF THE DRAWINGS

For a detailed description of various examples, reference will now be made to the accompanying drawings in which.

DETAILED DESCRIPTION

Disclosed herein are switching converter topologies involving a self-operated negative boost switch. In the disclosed topologies, the self-operated negative boost switch includes a first transistor and a second transistor between a first inductor node and a negative output supply node. The self-operated negative boost switch also includes a regulation circuit configured to maintain a reference voltage at the control terminal of the first transistor. In some examples, the reference voltage is maintained at the voltage level of the negative output supply node plus an offset (e.g., 4-5 volts). In some examples, the first transistor is a laterally diffused metal oxide semiconductor (LDMOS) transistor and the second transistor is a diode-connected P-type metal oxide semiconductor (PMOS) transistor. Also, the LDMOS transistor has a first breakdown voltage (e.g., 30 volts) and the diode-connected PMOS transistor has a second breakdown voltage (e.g., 5 volts) that is less than the first breakdown voltage.

In some examples, the regulation circuit includes a transistor with a first current terminal, a second current terminal, and a control terminal. The first current terminal of the transistor is coupled to a power supply node and a first end of a current source or resistor. The control terminal of the transistor is coupled to a second end of the current source or resistor, a cathode of a Zener diode, a first end of a first resistor, and a first plate of a first capacitor. The second current terminal of the transistor is coupled to the control terminal of the first transistor, a second plate of the first capacitor, a first end of a second resistor, and a first plate of a second capacitor. Also, an anode of the Zener diode, a second end of the first resistor, a second end of the second resistor, and a second plate of the second capacitor are coupled together to the negative rail of the converter. With the regulation circuit, the negative boost switch is self-operated and supports a negative boost mode.

In some examples, the switching converter has a single-input multiple-output (SIMO) converter topology. An example SIMO converter includes an inductor, a first switch between a first end of the inductor and a power supply node, a second switch (a self-operated negative boost switch) between the first end of the inductor and a negative output supply node, a third switch coupled between a second end of the inductor and a positive output supply node, and a fourth switch coupled between the second end of the inductor and a ground node. The SIMO converter also includes a controller coupled to the first, second, third, and fourth switches, where controller directs operations of the first, second, third, and fourth switches to transition from a rest state, to at least one boost iteration, and back to a rest state. In the disclosed topologies, the second switch is self-operated and does not need controller input, except perhaps a static enable. In some examples, each boost iteration involves performing an inductor charge mode followed by a positive or negative boost mode. As needed, multiple boost iterations are performed before transitioning back to the rest state. In some examples, a negative boost mode involves the operations of a self-operated negative boost switch as described herein. To provide a better understanding, various switching converter options and self-operated negative boost switch options are described using the figures as follows.

Figure 1:
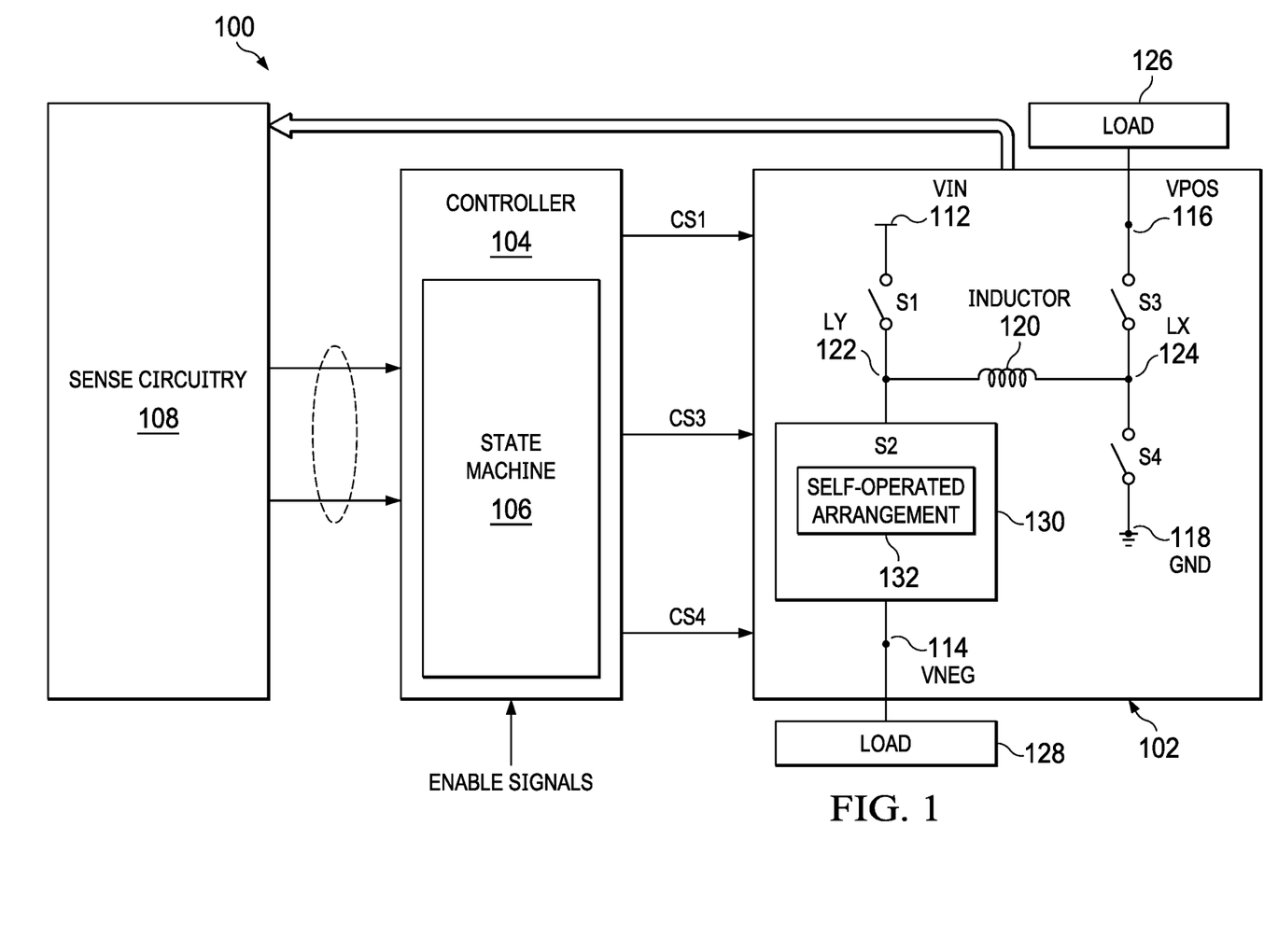
FIG. 1 is a block diagram showing a switching converter system in accordance with various examples.

FIG. 1 is a block diagram showing a switching converter system 100 in accordance with various examples. In FIG. 1, the system 100 represents a consumer product, an integrated circuit or chip, a printed circuit board (PCB) with integrated circuit and/or discrete components, and/or another electrical device. As shown, the system 100 comprises a SIMO converter circuit 102 coupled to a controller 104. The system 100 also comprises a sense circuit 108 coupled to the SIMO converter circuit 102 and to the controller 104. The system 100 also comprises a first load 126 coupled to a positive output supply node 116 of the SIMO converter circuit 102. The system 100 also comprises a second load 128 coupled to a negative output supply node 114 of the SIMO converter circuit 102. In other examples, the first load 126, the second load 128, and/or another load are coupled to both the positive output supply node 116 and the negative output supply node 114.

In the example of FIG. 1, the SIMO converter circuit 102 comprises a first switch (S1) coupled between a power supply (VIN) node 112 and a first inductor node (labeled "LY") 122. The SIMO converter circuit 102 also comprises a negative boost switch 130 (S2) coupled between the first inductor node 122 and the negative output supply node 114, where S2 has a self-operated arrangement 132. The SIMO converter circuit 102 also comprises a third switch (S3) coupled between a second inductor node (labeled "LX") 124 and the positive output supply node 116. The SIMO converter circuit 102 also comprises a fourth switch (S4) coupled between the second inductor node 124 and a ground node 118. In some examples, a SIMO converter circuit, such as the SIMO converter circuit 102, may have multiple positive and negative rails (output supply nodes controlled by switches). In such examples, the switches for each of the positive rails may be controlled together or individually. Similarly, the switches for each of the negative rails may be controlled together or individually.

In FIG. 1, an inductor 120 is coupled between the first and second inductor nodes 122 and 124. In some examples, the inductor 120 is a discrete component that is added to the SIMO converter circuit 102 by coupling respective terminals of the inductor 120 to the first and second inductor nodes 122 and 124. In contrast, the other components of the SIMO converter circuit 102 may be part of an integrated circuit. In some examples, the inductor 120 is part of an integrated circuit. For example, an on-chip inductor may be placed side-by-side or on top of other integrated circuit components to form a multi-chip-module (MCM) configuration. This MCM configuration may be packaged and commercialized as a single integrated circuit or product. In another example, a discrete inductor is packaged together with an integrated circuit that includes some of the components of the system 100 to create a single packaged product. In different example examples, a single integrated circuit or multiple integrated circuits include the components represented for the SIMO converter circuit 120 in FIG. 1, the controller 102, and/or the sense circuitry 108. Also, in some examples, the first and second loads 126 and 128 are separate components or circuits relative to the SIMO converter circuit 102, the controller 104, and the sense circuit 108.

In the example of FIG. 1, the controller 104 supports various modes for the SIMO converter circuit 102 as well as at least one rest state. More specifically, the controller 104 is configured to provide an inductor charge mode, a positive boost mode, a negative boost mode, and at least one rest state. For the inductor charge mode, the controller 104 is configured to close S1 and S4 and to open S3. In the inductor charge mode, S2 is self-operated and in its off state (no current flow through S2). For the positive boost mode, the controller 104 is configured to close S1 and S3 and to open S4. In the positive boost mode, S2 is self-operated and in its off state. For the negative boost mode, the controller 104 is configured to close S4 and to open S1 and S3. In the negative boost mode, current flow steers from S1 to S2, causing S2 switch to turn on based on the self-operated arrangement 132. In one example rest state, the controller 104 is configured to close S1 and to open S3 and S4. In this example rest state, S2 is self-operated and in its off state. In another example rest state, the controller 104 is configured to close S4 and to open S1 and S3. In this example rest state, S2 is self-operated and in its off state. In the different modes, S2 is a self-operated switch that turns on when the voltage at the LY node 122 abruptly decreases and current flows through S2 body diodes. Also, S2 is a self-operated switch that turns off when the inductor current reverses and the voltage at the LY node 122 increases from a voltage near VNEG (the voltage at the negative output supply node 114) to VNEG plus an offset (e.g., ~4-5V).

In some examples, the controller 104 comprises a state machine 106 configured to adjust control signals (CS1, CS3, and CS4) for S1, S3, and S4 of the SIMO converter circuit 102 to achieve the various modes or rest states described herein without a clock signal. More specifically, in the example of FIG. 1, the controller 104 receives various input signals from the sense circuit 108 and adjusts the operations of S1, S3, and S4 to achieve the various modes or rest states described herein. Meanwhile, S2 is self-operated as described herein to achieve the various modes or rest states described herein.

In some examples, the controller 104 performs a state machine cycle that includes starting at a rest state. The state machine cycle also includes performing at least one boost iteration that includes the inductor charge mode and the positive or negative boost mode. The state machine cycle also includes returning to one of the first or second rest states. In some examples, the controller 104 includes arbitration logic (see e.g., the arbitration logic 240 in FIG. 2) configured to determine whether the positive boost mode or the negative boost mode is used in a given boost iteration. In some examples, the arbitration logic uses sense signals from the sense circuit 108 to determine whether the positive boost mode or the negative boost mode is used in a given boost iteration.

Once a boost iteration is triggered, the controller 104 performs an inductor charge mode by closing S1 and S4 while S2 and S3 are open. In some examples, the inductor charge mode continues until the inductor charge is above a threshold. After the inductor charge mode is complete, the controller 104 transitions to the positive boost mode or the negative boost mode depending on arbitration results (e.g., which output supply voltage is farthest from a respective target and/or other criteria). After a positive or negative boost mode is complete, the controller 104 transitions to another boost iteration or to one of the rest states depending on the input signals to the controller 104.

In the example of FIG. 1, the negative boost switch 130 (S2) includes a self-operated arrangement 132. In some examples, the self-operated arrangement 132 corresponds to a first transistor and a second transistor between the LY node 122 and the negative output supply node 114. The self-operated arrangement 132 also includes a regulation circuit configured to maintain a reference voltage at the control terminal of the first transistor. In some examples, the reference voltage is maintained at the voltage level of the negative output supply node 114 plus an offset (e.g., 4-5 volts). In some examples, the first transistor is a LDMOS transistor and the second transistor is a diode-connected PMOS transistor. Also, the LDMOS transistor has a first breakdown voltage (e.g., 30 volts) and the diode-connected PMOS transistor has a second breakdown voltage (e.g., 5 volts) that is less than the first breakdown voltage.

In some examples, the regulation circuit for the self-operated arrangement 132 includes a transistor with a first current terminal, a second current terminal, and a control terminal. The first current terminal of the transistor is coupled to a power supply node and a first end of a current source. The control terminal of the transistor is coupled to a second end of the current source, a cathode of a Zener diode, a first end of a first resistor, and a first plate of a first capacitor. The second current terminal of the transistor is coupled to the control terminal of the first transistor, a second plate of the first capacitor, a first end of a second resistor, and a first plate of a second capacitor. Also, an anode of the Zener diode, a second end of the first resistor, a second end of the second resistor, and a second plate of the second capacitor are coupled together. With the self-operated arrangement 132, S2 allows current flow between the LY node 122 and the negative output supply node 114 to boost the voltage level at the negative output supply node 114 as needed (i.e., the self-operated arrangement 132 supports a negative boost mode of the SIMO converter circuit 102).

Figure 2:
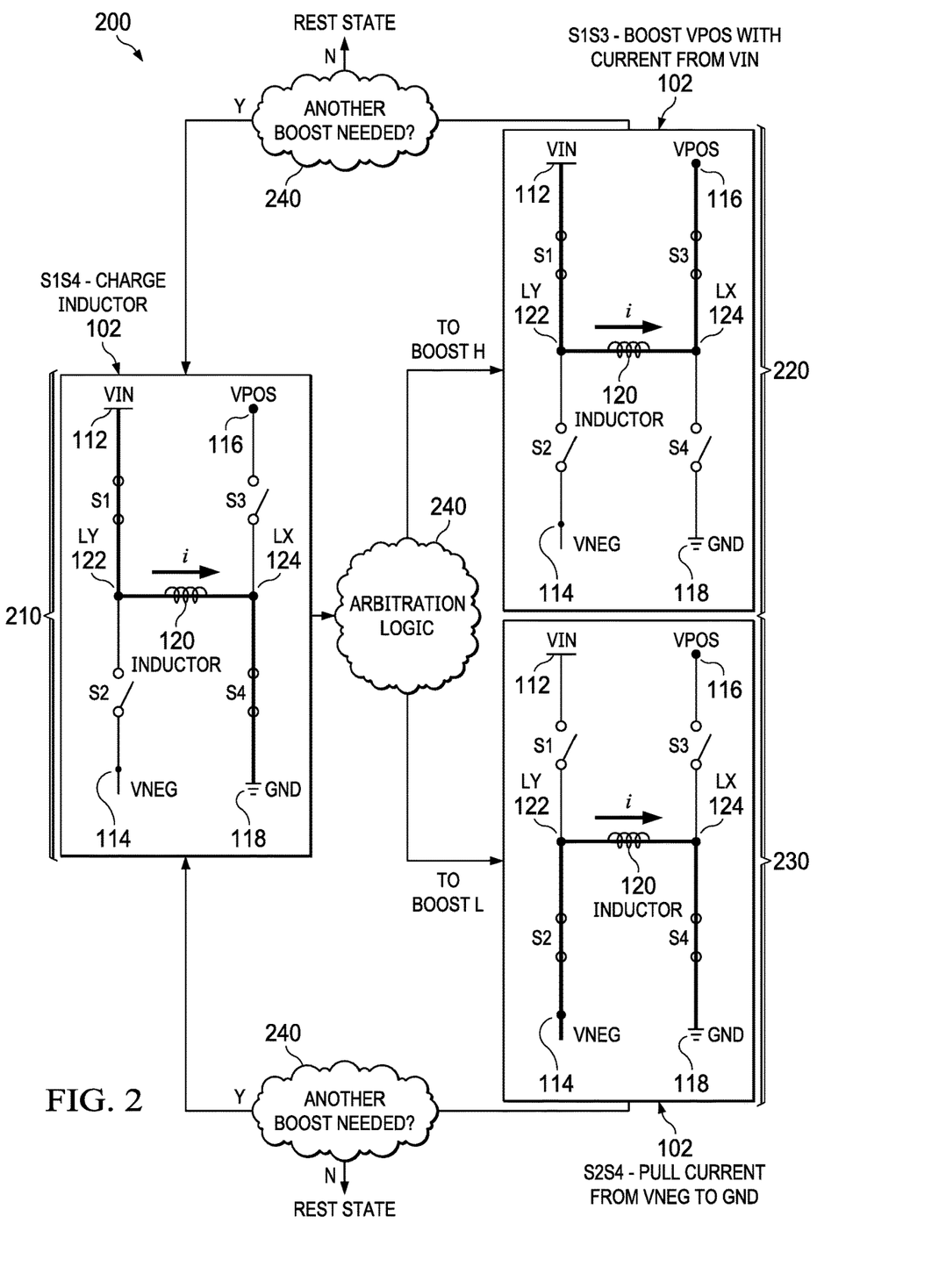
FIG. 2 is a set of schematic diagrams showing a boost iteration scenario in accordance with various examples.

FIG. 2 is a set of schematic diagrams showing a boost iteration scenario 200 in accordance with various examples. In scenario 200, a boost iteration is initiated by transitioning from a rest state (not shown) to an inductor charge mode arrangement 210 for the SIMO converter circuit 102. As shown in FIG. 2, the inductor charge mode arrangement 210 corresponds to S1 and the negative boost switch 130 (S2) being closed while S2 and S3 are open. After the inductor charge mode is complete, arbitration logic 240 determines whether a positive boost or a negative boost will be performed.

In scenario 200, a positive boost is performed by transitioning from the inductor charge mode arrangement 210 for the SIMO converter circuit 102 to the positive boost arrangement 220 for the SIMO converter circuit 102. As shown, the positive boost mode arrangement 220 corresponds to S1 and S3 being closed while the negative boost switch 130 (S2) and S4 are open. After the positive boost mode is complete, arbitration logic 240 determines whether another boost iteration is needed. If so, the scenario 200 returns to the inductor charge mode arrangement 210 for the SIMO converter circuit 102, and subsequently another positive or negative boost. Otherwise, if another boost iteration is not needed, the boost iteration scenario 200 is complete and the SIMO converter circuit 102 is placed in a rest state.

In scenario 200, a negative boost is performed by transitioning from the inductor charge mode arrangement 210 for the SIMO converter circuit 102 to the negative boost arrangement 230 for the SIMO converter circuit 102. As shown, the negative boost mode arrangement 230 corresponds to the negative boost switch 130 (S2) and S4 being closed while S1 and S3 are open. In the example of FIG. 2, the negative boost switch 130 (S2) includes a self-operated arrangement (e.g., the self-operated arrangement 132 in FIG. 1). With the self-operated arrangement, S2 switch turns on as soon as the LY node 122 decreases in voltage and current flows through S2 body diodes. Also, with the self-operated arrangement, S2 turns off as soon as LY increases from a voltage near VNEG to VNEG plus an offset (e.g., ~4-5V). After the negative boost mode is complete, arbitration logic 240 determines whether another boost iteration is needed. If so, the scenario 200 returns to the inductor charge mode arrangement 210 for the SIMO converter circuit 102, and subsequently another positive or negative boost is performed. Otherwise, if another boost iteration is not needed, the boost iteration scenario 200 is complete and the SIMO converter circuit 102 is placed in a rest state.

Figure 3:
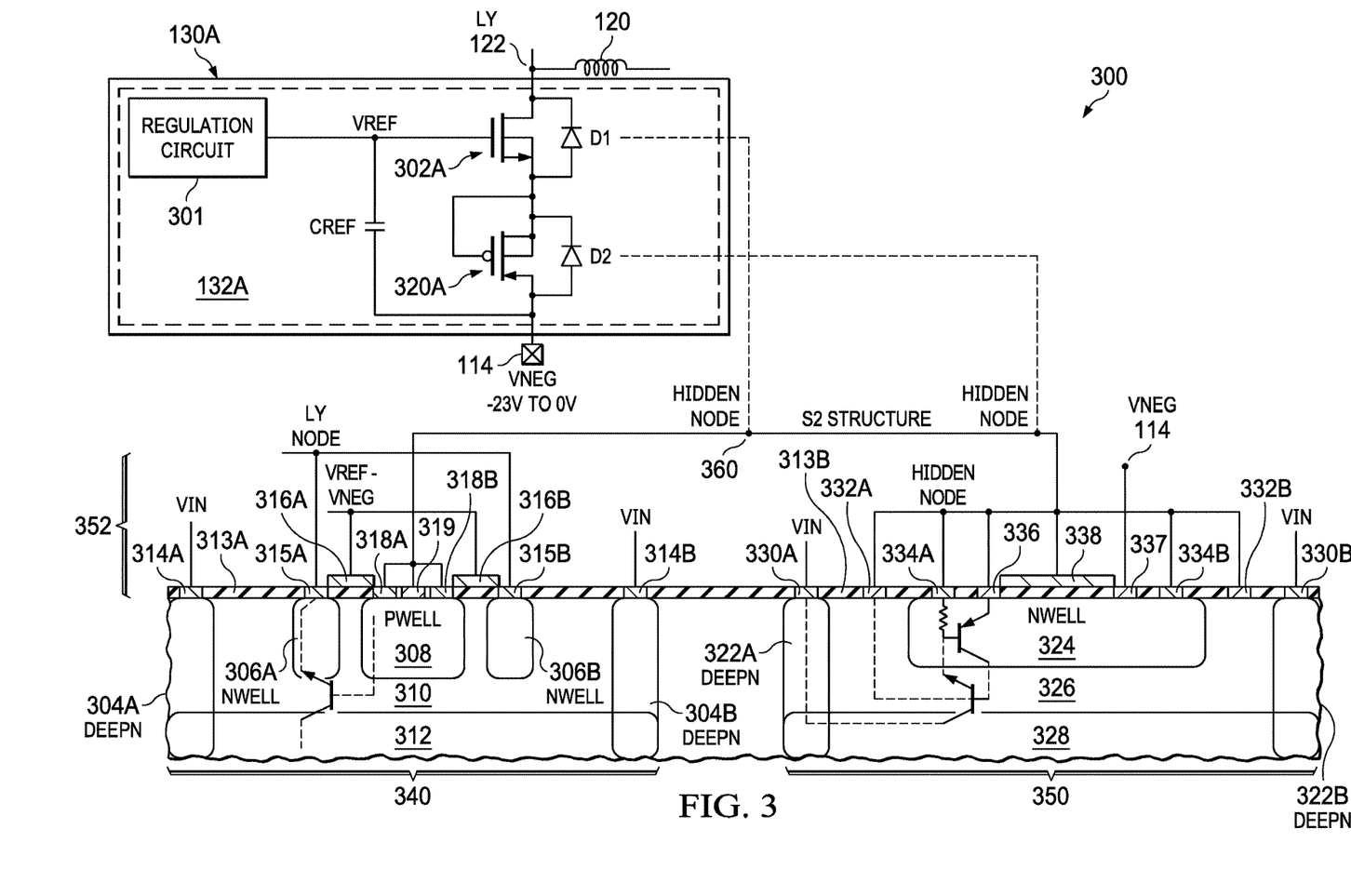
FIG. 3 is a schematic diagram and cross-sectional views of components of a switch with a self-operated arrangement in accordance with various examples.

FIG. 3 is a schematic diagram 300 and cross-sectional views of components of a negative boost switch 130A (an example of the negative boost switch 130 in FIGS. 1 and 2) with a self-operated arrangement 132A (an example of the self-operated arrangement 132 in FIG. 1) in accordance with various examples. As shown in the schematic diagram 300, the negative boost switch 130A with the self-operated arrangement 132A includes an LDMOS transistor 302, a diode-connected PMOS transistor 320, and a regulation circuit 301. More specifically, a first current terminal of the LDMOS transistor 302 is coupled to the LY node 122 of a switching converter (e.g., the LY node 122 is a first inductor node as describe in FIG. 1). The second current terminal of the LDMOS transistor 302 is coupled to the first current terminal and to the control terminal of the diode-connected PMOS transistor 320. The control terminal of the LDMOS transistor 302 is coupled to the regulation circuit 301 and to the top plate of a capacitor ($C_{REF}$). Also, the second current terminal of the diode-connected PMOS transistor 320 is coupled to the bottom plate of $C_{REF}$.

In some examples, the regulation circuit 301 is configured to maintain a reference voltage at the control terminal of the LDMOS transistor 302. In some examples, the reference voltage is maintained at the voltage level (e.g., −23 to 0 volts) of the negative output supply node 114 plus an offset (e.g., 4-5 volts). In some examples, the LDMOS transistor 302 has a first breakdown voltage (e.g., 30 volts) and the diode-connected PMOS transistor 320 has a second breakdown voltage (e.g., 5 volts) that is less than the first breakdown voltage.

As shown in cross-sectional views 340 and 350, the structure for the LDMOS transistor 302 and the diode-connected PMOS transistor 320 includes various layers, including a contact layer 352. More specifically, in the cross-sectional views 340 for the LDMOS transistor 302, the contact layer 352 includes power supply (VIN) contacts 314A and 314B, drain contacts 315A and 315B, gate contacts 316A and 316B, source contacts 318A and 318B, and a BG node 319. There is also an isolation (ISO) region 313A region around transistor structures to isolate the transistor from adjacent circuits. In the example of FIG. 3, the ISO region 313A corresponds to the deep N-type wells 304A and 304B, and the N-type buried layer 312. As shown, the power supply contacts 314A and 314B are configured to receive a power supply (VIN) voltage (e.g., 0-5 volts). Also, the drain contacts 315A and 315B are configured to receive a voltage (e.g., −24.5 to 5 volts) from the LY node 122. Also, the gate contacts 316A and 316B are configured to receive a reference voltage (VREF) from the regulation circuit 301, where VREF is set to voltage at the negative output supply node 114 plus an offset (e.g., 4-5 volts). Also, the source contacts 318A and 318B, and the BG node 319 are at a voltage level below zero set by the LY node 122 (e.g., −24.5 to 0 volts). In the example of FIG. 3, the BG node 319 and the source contacts 318A and 318B correspond to a hidden node 360 coupled to the diode-connected PMOS transistor 320.

In some examples, for the LDMOS transistor 302, there are various layers various zones or layers below the contact layer 352. For example, as represented in the cross-sectional view 340, there are deep N-type wells 304A and 304B below respective power supply contacts 314A and 314B. Also, there are N-type wells 306A and 306B below respective drain contacts 315A and 315B. Also, in some examples, there is a P-type well 308 below the source contacts 318A and 318B and the BG contact 319. As represented in the cross-sectional view 340, the gate contact 316A extends over part of the N-type well 306A and the P-type well 308. Similarly, the gate contact 316B extends over part of the N-type well 306B and the P-type well 308. Between the various wells (e.g., the deep N-type wells 304A and 304B, the N-type wells 306A and 306B, and the P-type well 308) is a P-type epitaxial material 310. Below the P-type epitaxial material 310 is a N-type buried layer 312. As represented in the cross-sectional view 340, the deep N-type wells 304A and 304B extend to the same plane as the N-type buried layer 312. In operation, the N-type well 306A, the P-type well 308, the P-type epitaxial material 310, and the N-type buried layer 312 behave similar to a bipolar transistor. Also, the region corresponding to the N-type well 306A, the P-type epitaxial material 310, and the deep N-type well 304A behaves similar to an NPN transistor. Also, the region corresponding to the N-type well 306B, the P-type epitaxial material 310, and the deep N-type well 304B behaves similar to an NPN transistor.

In the cross-sectional view 350 of the diode-connected PMOS transistor 320, the structure for the diode-connected PMOS transistor 320 is represented. As shown, the diode-connected PMOS transistor 320 includes various contacts at the contact layer 352. More specifically, the contact layer 352 includes power supply (VIN) contacts 330A and 330B, P-type epitaxial nodes 332A and 332B, BG nodes 334A and 334B, a drain contact 336, a source contact 337, and a gate contact 338. There is also an ISO region 313B around transistor structures to isolate the transistor from adjacent circuits. In the example of FIG. 3, the ISO region 313B corresponds to the deep N-type wells 322A and 322B, and the N-type buried layer 328. As shown, the power supply contacts 330A and 330B are configured to receive a power supply (VIN) voltage (e.g., 0-5 volts). Also, the P-type epitaxial nodes 332A and 332B, and the BG nodes 334A and 334B are coupled to the hidden node 360 (with a voltage level of −24.5 to 0 volts), which is coupled to the source nodes 318A and 318B of the LDMOS transistor 302. Also, the drain contacts 336 and the gate 338 are configured to receive a voltage (e.g., −24.5 to 0 volts) from the hidden node 360 corresponding to the source nodes 318A and 318B of the LDMOS transistor 302 Meanwhile, the source contact 337 is coupled to the negative output supply node 114.

For the diode-connected PMOS transistor 320, there are various layers various zones or layers below the contact layer 352. For example, as represented in the cross-sectional view 350, there are deep N-type wells 322A and 322B below respective power supply contacts 330A and 330B. Also, there is an N-type well 324 below the BG nodes 334A and 334B, the drain contact 336, the gate contact 338, and the source contact 337. Between the various wells (e.g., the deep N-type wells 322A and 322B, the N-type well 324) is a P-type epitaxial material 326. Below the P-type epitaxial material 326 is a N-type buried layer 328. As represented in the in the cross-sectional view 350, the deep N-type wells 322A and 322B extend to the same plane as the N-type buried layer 328. In operation, the N-type well 324, the P-type epitaxial material 310, the N-type buried layer 312, and N-type deep well 322A behave similar to a pair of bipolar transistors as represented in FIG. 3.

With the negative boost switch 130A of FIG. 3, the various switch converter modes described herein are supported using a self-operated arrangement (e.g., the self-operated arrangement 132 in FIG. 1) For example, during an inductor charge-discharge transition, S1 is turned off while the inductor 120 is magnetized with a peak current. As S1 turns off, the current through the inductor 120 steers from S1 to the negative boost switch 130A and to parasitic capacitance of the LY node 122, causing the voltage at the LY node 122 to decrease towards VNEG. When the voltage at the LY node 122 reaches the control terminal voltage (e.g., Vgate=− 18 V), the drain-BG diode for the LDMOS transistor 302 conducts for a short amount of time and the Nwell-Pepi-NBL parasitic BJT for the LDMOS transistor 302 conducts for a brief period of time until the voltage between the control terminal and the drain terminal of the LDMOS transistor 302 become higher than the LDMOS threshold voltage (~1V). When this occurs, the LDMOS channel forms and the current is efficiently conducted through the LDMOS channel. At this point, the LY node 122 and the hidden node 360 are connected together through the LDMOS channel. Consequently, the voltage at the hidden node 360 and the LY node 122 decreases until the SRC-BG diode for the PMOS transistor 320 begins to conduct, clamping the voltage at the LY node 122 to a diode drop below VNEG. Note that the SRC-BG diode conduction will turn on a parasitic PNP corresponding to a SRC-BG-Pepi region of the PMOS transistor 320. However, the collector terminal of the PNP region of the PMOS transistor 320 is connected to the hidden node 360, which helps the intended conduction path. Also, the NPN region created by the NWELL-Pepi-NBL regions of the PMOS transistor 320 does not turn ON since its base and emitter terminals are connected together. Note that if the structure of FIG. 3 were to be replaced by a single high voltage LDMOS with a controller and gate driver, the LDMOS parasitic NPN would conduct for the duration of the driver delay, causing excessive power loss in some examples.

Figure 4:
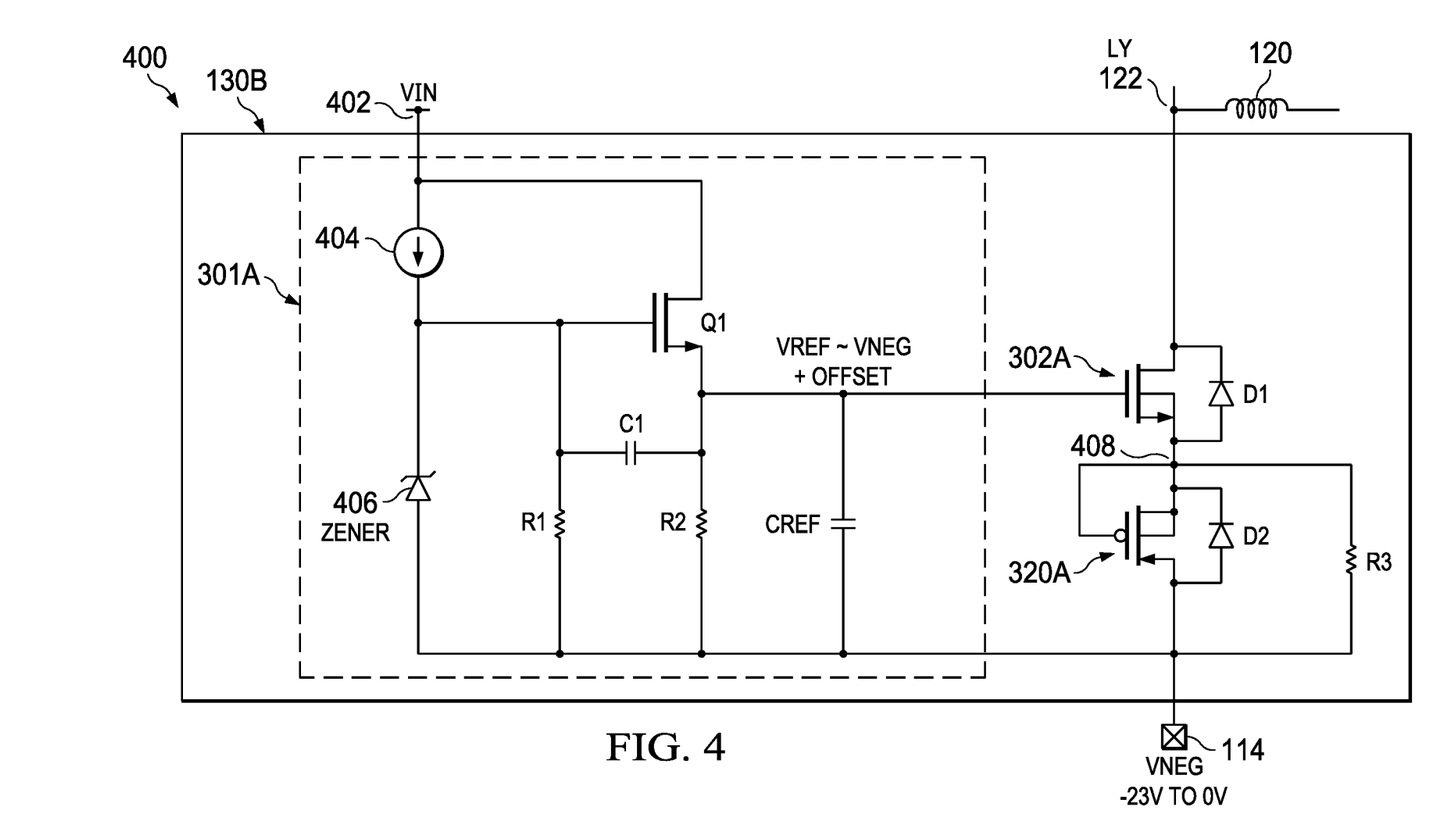
FIG. 4 is another schematic diagram showing a negative boost switch with a self-operated arrangement in accordance with various examples.

FIG. 4 is another schematic diagram 400 showing a negative boost switch 130B with a self-operated arrangement in accordance with various examples. In the example of FIG. 1, the self-operated arrangement for the negative boost switch 130B is achieved using a first transistor 302A (e.g., an LDMOS transistor), a second transistor 320A (e.g., a diode-connected PMOS transistor), and a regulation circuit 301A. In some examples, the regulation circuit 301A is configured to maintain a reference voltage at the control terminal of the first transistor 302A. In some examples, the reference voltage is maintained at the voltage level (e.g., -23 to 0 volts) of the negative output supply node 114 plus an offset (e.g., 4-5 volts). In some examples, the first transistor 302A has a first breakdown voltage (e.g., 30 volts) and the second transistor 320A has a second breakdown voltage (e.g., 5 volts) that is less than the first breakdown voltage.

In the example of FIG. 4, the regulation circuit 301A includes a transistor (Q1) with a first current terminal, a second current terminal, and a control terminal. The first current terminal of Q1 is coupled to a power supply node 402 and to a first end of a current source 404. In another example, the current source 404 is replaced by a resistor. The control terminal of Q1 is coupled to a second end of the current source 404, a cathode of a Zener diode 406, a first end of a first resistor (R1), and a first plate of a first capacitor (C1). The second current terminal of Q1 is coupled to the control terminal of the first transistor 302A, a second plate of C1, a first end of a second resistor (R2), and a first plate of a second capacitor (CREF). Also, an anode of the Zener diode 406, a second end of R1, a second end of R2, and a second plate of CREF are coupled together. In the example of FIG. 4, a Zener diode 410 is in parallel with CREF. Also, a third resistor (R3) is between the negative output supply node 114 and a hidden node 408 (an example of the hidden node 360 in FIG. 3) coupled to the first current terminal of the second transistor 320A. Without limitation to other examples, the Zener diode 406 has a breakdown voltage of 5.5 volts, Q1 has a breakdown voltage of 30 volts, R2 may have a value of 2 MΩ, and CREF may have a value of 100 pF. With the regulation circuit 301A, the negative boost switch is self-operated and supports a negative boost mode.

In the example of FIG. 4, C1 plays an important role in maintaining high efficiency of a switching converter (e.g., the SIMO converter circuit 102 of FIG. 1). Without C1, Q1 would supply large transient currents to maintain the voltage at the control terminal of the transistor 302A constant every time the transistor 302A begins to conduct current and excess charge would be drained through the Zener diode 410 every time transistor 302A turns off. With C1 in place, Q1 behaves like a small current source at high frequencies, which limits the amount of average current taken from the input supply voltage (VIN) node 402. In this case, most of the charge required to turn on transistor 302A comes from CREF. When the transistor 302A turns off, the burrowed charge stored in transistor 302A returns to CREF, with very little charge dumped through Zener diode 410.

Figure 5:
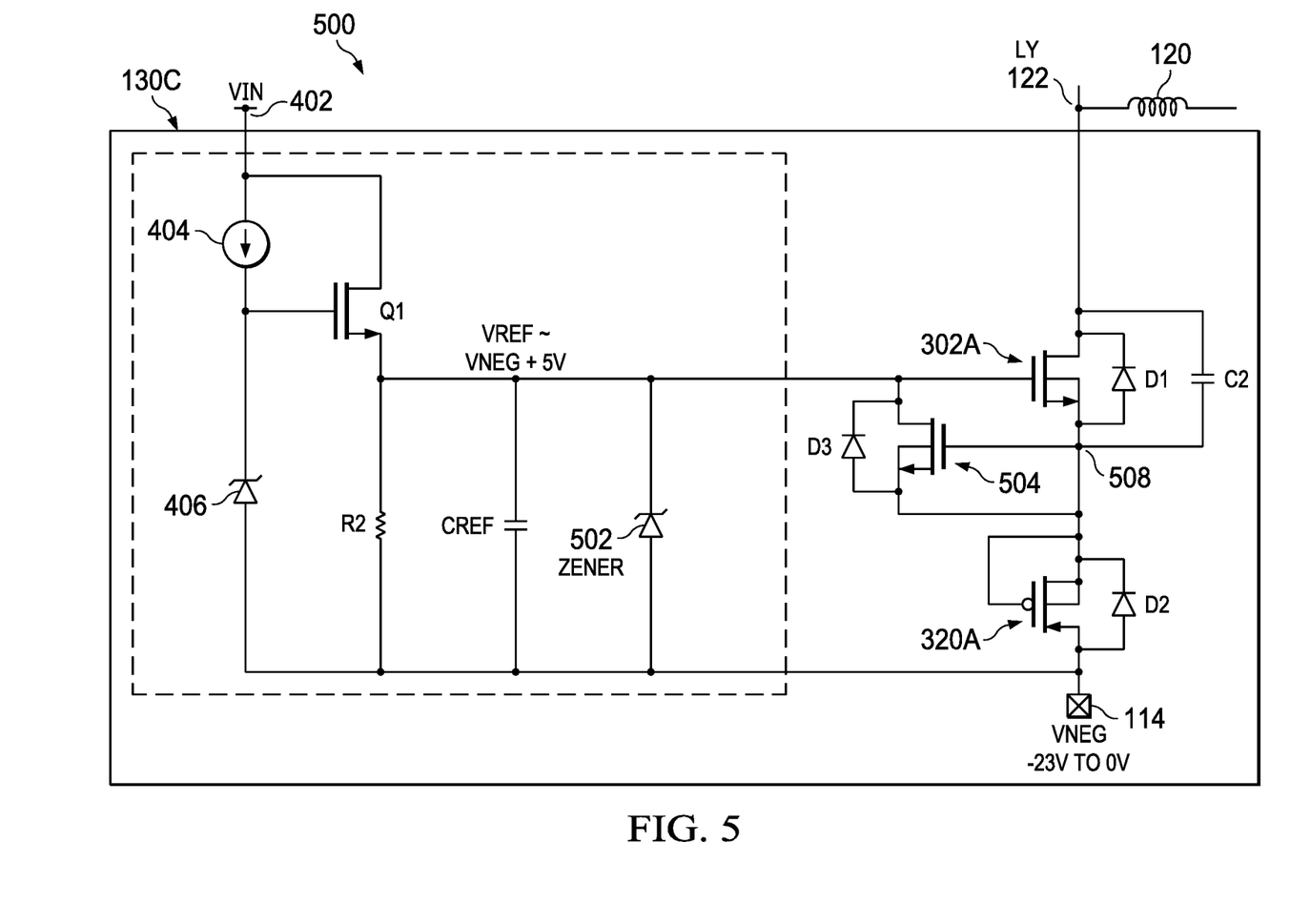
FIG. 5 is another schematic diagram showing a negative boost switch with a self-operated arrangement in accordance with various examples.

FIG. 5 is another schematic diagram 500 showing a negative boost switch 130C with a self-operated arrangement in accordance with various examples. As shown, the negative boost switch 130C of FIG. 5 is similar to the negative boost switch 130B of FIG. 4, where various components (e.g., the current source 404, the Zener diode 406, Q1, R2, CREF, the first transistor 302A, and the second transistor 320A) described for the negative boost switch 130B of FIG. 4 are included in the negative boost switch 130C of FIG. 5. For the negative boost switch 130C, a transistor 504 (e.g., a natural NMOS clamp) has its current terminals coupled to VREF (the control signal for the first transistor 302A) and the hidden node 508 (an example of the hidden node 360 in FIG. 3). A natural NMOS clamp or other natural device clamp is "on" when the control terminal voltage is above zero and is "off" when the control terminal voltage is negative. As shown in FIG. 5, the control terminal of the transistor 504 is coupled to the hidden node 508. Also, there is a second Zener diode 502 in parallel with CREF in the negative boost switch 130C. Also, there is another capacitor (C2) between the hidden node 502 and a first current terminal of the first transistor 302A.

Without C2 and the transistor 504, the parasitic BJT of the first transistor 302A will turn on for a brief amount of time. In some examples, this translates into a small efficiency loss of 1~2%, since the inductor current is conducted from the voltage supply node 402 to the LY node 122 through the parasitic BJT of the first transistor 302A. C2 prevents this current from occurring as follows. When S1 device is turned off, the voltage at the LY node 122 rapidly decreases towards VNEG. As this occurs, C2 pushes the source of the first transistor 302A lower than the control terminal of the first transistor, creating a channel even before the voltage at the LY node 122 reaches the control terminal voltage (-18V). Once the voltage at the LY node 122 reaches -18V, the inductor current flows through the channel instead of the parasitic BJT. When the inductor current becomes zero, the voltage at the LY node 122 increases towards VIN (e.g., 3V) and the voltage at the hidden node 502 increases towards a voltage greater than the voltage at the control terminal due to the capacitive coupling action of C2. The transistor 502 turns on once the voltage at the source of the first transistor 302A becomes greater than the voltage at the gate of the first transistor 302A. Eventually, the voltage at the hidden node 508 is recharged until the voltage at the source of the first transistor 302A becomes equal to the voltage at the gate of the first transistor 302A.

Figure 6:
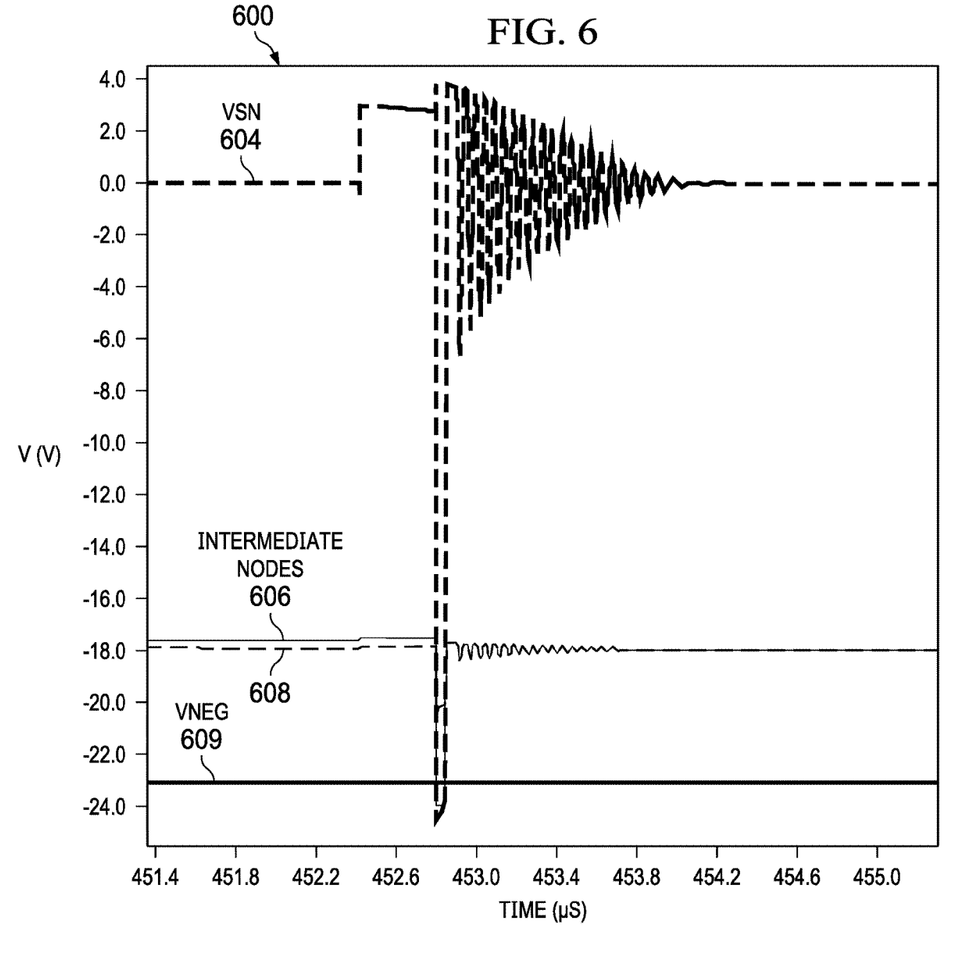
FIG. 6 is timing diagram showing voltage at a first inductor node as a function of time in accordance with various examples.

FIG. 6 is timing diagram 600 showing voltage at a first inductor node (e.g., the LY node 122) as a function of time in accordance with various examples. In the timing diagram 600, the voltage level (VNEG) at the negative output supply node (e.g., node 114) is around -23 volts. As shown, the voltage waveform 604 for the LY node 122 starts at zero, increases to around 3 volts, drops temporarily to around -24 volts, then oscillates while returning to zero. The voltage waveform 606 for the hidden node starts at about -18 volts and temporarily follows the voltage at the LY node 122 to about -24 volts, then continues to follow the voltage at the LY node 122 up to -18 volts. Subsequently, the voltage waveform 606 for the hidden node oscillates. The voltage waveform 608 for the control terminal of the first transistor (e.g., the LDMOS device) starts at -18 volts and drops to around -20 volts temporarily when the voltage waveform 604 for the LY node drops to -24 volts. When this occurs, the self-operated switch represented in FIG. 4 is turned on since the voltage at the control terminal voltage increases relative to the voltage at the hidden node (e.g., -20V--24 V=+4 V). The voltage at the control terminal then comes back to -18 volts (0V relative to the voltage at the hidden node) and therefore the first transistor (e.g., the LDMOS device) turns off without the involvement of a separate controller.

Figure 7:
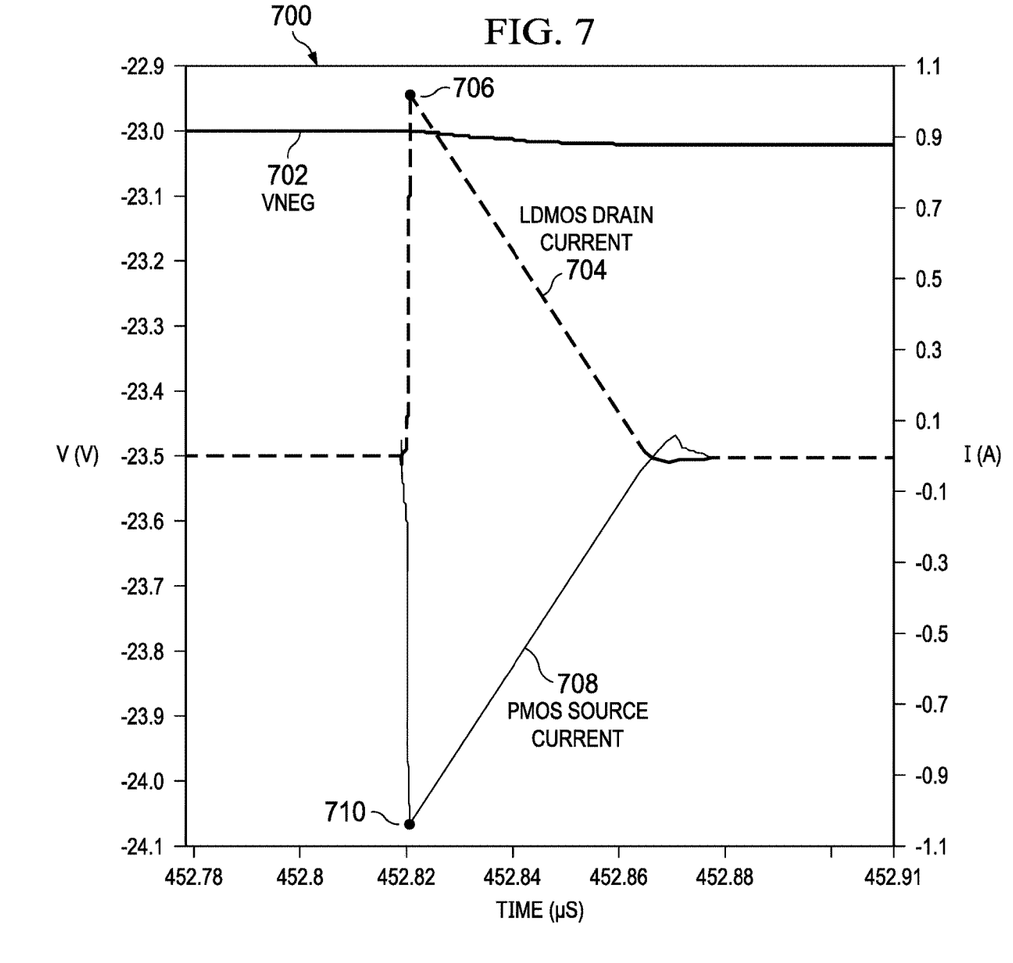
FIG. 7 is timing diagram showing drain current and source current of transistors of a negative boost switch with a self-operated arrangement.

FIG. 7 is timing diagram 700 showing drain current and source current waveforms of transistors of a negative boost switch with a self-operated arrangement in accordance with various examples. In the timing diagram 700, the voltage level (VNEG) at the negative output supply node (e.g., node 114) is around −23 volts. When the S1 device turns off, the inductor current steers from S1 to the inductor 120, to S4, to S2, to the inductor 120, and to S4, causing the voltage at the LY node 122 to drop towards the voltage level at the negative output supply node (e.g., node 114) as represented in FIG. 6. During this event, the drain current of the first transistor 302A (e.g., an LDMOS transistor with a breakdown voltage of 30 volts) increases quickly, following the inductor current magnitude, then slowly drops again as represented by the current waveform 704 The peak current for the current waveform 704 is indicated at peak 706. Also, when the voltage at the LY node 122 drops towards the voltage level at the negative output supply node (e.g., node 114) as represented in FIG. 6, the source current or the body diode current of the second transistor 320A (e.g., a diode-connected PMOS transistor with a breakdown voltage of 5 volts) decreases quickly then slowly increases again as represented by the waveform 708. During these events, when the LDMOS and PMOS backgate currents cross 0 Amps, the inductor 120 is still biased at −23V, causing the voltage at the hidden node (e.g., the hidden node 360 in FIG. 3, the hidden node 408 in FIG. 4, or the hidden node 502 in FIG. 5), and the voltage at the control terminal of the LDMOS device to jump to around −18 Volts (e.g., the LDMOS turns off by the natural action of the inductor rise in current when it is biased at a large negative voltage). The voltage at the LY node 122 then continues to increase to around 3 volts and oscillates. The minimum current for the current waveform 708 is indicated at negative peak 710.

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Modifications are possible in the described embodiments, and other embodiments are possible, within the scope of the claims. Also, the first transistor 302A only has to support high voltage (to block the low voltage diode or the second transistor 320A from being stressed at high voltage) and does not need to be an LDMOS device. Thus, the first transistor 302A is an LDMOS device or another device with a breakdown voltage above a target threshold. Also, a low voltage diode may be used instead of the second transistor 320A (e.g., PMOS transistor). Thus, the second transistor 320A is a PMOS device or another device with a breakdown voltage below the target threshold. The design target is that there should be no parasitic current path that takes away current from the intended current path through negative output supply node 114, to the LY node 122, to the LX node 124, and to the GND node 118. Also, the offset used in the self-operated switch (S2) depends on the Vt of the first transistor 302A (e.g., the LDMOS device). While a larger offset is desired, some care should be taken to avoid damage the control terminal of the first transistor 302A. In some process technologies, 5V is a safe voltage. In other process technologies, the offset will vary.

What is claimed is:

1. A system, comprising:
   a first switch coupled between a first inductor terminal and a voltage supply terminal;
   a second switch coupled between the first inductor terminal and a negative output supply terminal, the second switch comprising: a transistor having a first breakdown voltage above a target threshold; and a diode-connected p-type field effect transistor (PFET) having a body diode between a current terminal of the PFET and the negative output supply terminal, in which the diode-connected PFET has a second breakdown voltage below the target threshold;
   a third switch coupled between a second inductor terminal and a positive output supply terminal;
   a fourth switch coupled between the second inductor terminal and a ground terminal; and
   a controller coupled to the first, second, third and fourth switches.

2. The system of claim 1, wherein the transistor is a laterally diffused metal oxide semiconductor (LDMOS) transistor.

3. The system of claim 2, wherein the LDMOS transistor has a vertical NPN structure that includes a n-type well region, a p-type epitaxial region, and a n-type buried layer region, and the LDMOS transistor has a lateral parasitic NPN structure constructed by the n-type well region, the p-type epitaxial region, and a deep n-type region.

4. The system of claim 1, wherein the PFET comprises:
   an n-type well body;
   a first current terminal contact; and
   a second current terminal contact, wherein the first and second current terminal contacts are coupled together.

5. The system of claim 1, further comprising a regulation circuit coupled to a control terminal of the self-regulated switch, wherein the regulation circuit is configured to supply a reference voltage equal to a voltage level at the negative output supply terminal plus an offset.

6. The system of claim 5, wherein the offset is between 4-5 volts.

7. A switching converter circuit, comprising:
   a first switch coupled between a first inductor terminal and a voltage supply terminal;
   a second switch coupled between the first inductor terminal and a negative output supply terminal, wherein the second switch comprises a laterally diffused metal oxide semiconductor (LDMOS) transistor with a control terminal coupled to a regulation circuit, and the regulation circuit is configured to maintain a voltage at the control terminal of the LDMOS transistor at a reference voltage equal to a voltage level at the negative output supply terminal plus an offset;
   a third switch coupled between a second inductor terminal and a positive output supply terminal;
   a fourth switch coupled between the second inductor terminal and a ground terminal; and
   a controller coupled to the first, second, third and fourth switches.

8. The switching converter circuit of claim 7, wherein the regulation circuit comprises:
   a transistor with a first current terminal, a second current terminal, and a control terminal,
   wherein the first current terminal of the transistor is coupled to a power supply terminal and to a first end of a current source, wherein the control terminal of the transistor is coupled to a second end of the current source, a cathode of a Zener diode, a first end of a first resistor, and a first plate of a first capacitor;

wherein the second current terminal of the transistor is coupled to the control terminal of the LDMOS transistor, a second plate of the first capacitor, a first end of a second reference, and a first plate of a second capacitor.

9. The switching converter circuit of claim 8, wherein an anode of the Zener diode, a second end of the first resistor, a second end of the second resistor, a second plate of the second capacitor are coupled together.

10. The switching converter circuit of claim 8, wherein the LDMOS transistor comprises a first current terminal coupled to the first inductor terminal and comprises a second current terminal coupled to a first current terminal of a diode-connected p-type field effect transistor (PFET), and wherein a second current terminal of the diode-connected PFET is coupled to the negative output supply terminal.

11. The switching converter circuit of claim 10, wherein a control terminal of the diode-connected PFET is coupled to a first side of a third resistor, and a second end of the third resistor is coupled to an anode of the Zener diode, a second end of the first resistor, a second end of the second resistor, a second plate of the second capacitor.

12. The switching converter circuit of claim 11, further comprising:
a third capacitor coupled between the control terminal of the diode-connected PFET and the first current terminal of the LDMOS transistor;
a second Zener diode in parallel with the second capacitor; and
a natural device clamp coupled to the control terminal of the LDMOS transistor.

13. The switching converter circuit of claim 10, wherein the LDMOS transistor has a first breakdown voltage and the diode-connected PFET has a second breakdown voltage that is less than the first breakdown voltage.

14. A device, comprising:
a first switch coupled between a first inductor terminal and a voltage supply terminal;
a second switch coupled between the first inductor terminal and a negative output supply terminal, wherein the second switch comprises a laterally diffused metal oxide semiconductor (LDMOS) transistor and a diode-connected p-type field effect transistor (PFET);
a third switch coupled between a second inductor terminal and a positive output supply terminal;
a fourth switch coupled between the second inductor terminal and a ground terminal; and
a controller coupled to the first, second, third and fourth switches.

15. The device of claim 14, further comprising a regulation circuit coupled to a control terminal of the LDMOS transistor, wherein the regulation circuit is configured to maintain a voltage at the control terminal of the LDMOS transistor at a reference voltage equal to a voltage level at the negative output supply terminal plus an offset.

16. The device of claim 15, wherein the regulation circuit comprises:
a transistor with a first current terminal, a second current terminal, and a control terminal,
wherein the first current terminal of the transistor is coupled to a power supply terminal and to a first end of a current source,
wherein the control terminal of the transistor is coupled to a second end of the current source, a cathode of a Zener diode, a first end of a first resistor, and a first plate of a first capacitor;
wherein the second current terminal of the transistor is coupled to the control terminal of the LDMOS transistor, a second plate of the first capacitor, a first end of a second resistor, and a first plate of a second capacitor.

17. The device of claim 16, wherein a control terminal of the diode-connected PFET is coupled to a first side of a third resistor, and a second end of the third resistor is coupled to an anode of the Zener diode, a second end of the first resistor, a second end of the second resistor, and a second plate of the second capacitor.

18. The device of claim 14, further comprising:
a third capacitor coupled between the control terminal of the diode-connected PFET and the first current terminal of the LDMOS transistor;
a second Zener diode in parallel with the second capacitor; and
a natural device clamp coupled to the control terminal of the LDMOS transistor.

19. The device of claim 14, wherein the LDMOS transistor has a first breakdown voltage and the diode-connected PFET has a second breakdown voltage that is less than the first breakdown voltage.

* * * * *